United States Patent
Tang

(10) Patent No.: US 6,904,101 B1
(45) Date of Patent: Jun. 7, 2005

(54) TUNELESS NARROW-BAND SUPER-REGENERATIVE RECEIVER

(75) Inventor: Qingfeng Tang, Farmington Hills, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 09/506,043

(22) Filed: Feb. 17, 2000

(51) Int. Cl.$^7$ ............................................. H04B 1/16
(52) U.S. Cl. ..................................... 375/316; 455/215
(58) Field of Search ............................. 375/338, 339, 375/375, 316; 455/215, 336, 85, 86, 76, 318; 327/524, 100, 182, 548, 530, 596; 331/1 R, 1, 4, 18, 172, 173, 187, 177 R, 177

(56) References Cited

U.S. PATENT DOCUMENTS

| | | | | |
|---|---|---|---|---|
| 4,129,869 A | * | 12/1978 | Morinaka | 342/51 |
| 4,198,601 A | * | 4/1980 | Ono et al. | 455/73 |
| 4,205,270 A | * | 5/1980 | Okatani et al. | 455/158.1 |
| 4,398,283 A | * | 8/1983 | Pottier | 370/281 |
| 4,620,147 A | * | 10/1986 | Niki | 324/76.15 |
| 5,235,294 A | * | 8/1993 | Ishikawa et al. | 333/17.1 |
| 5,548,832 A | * | 8/1996 | Karam | 455/226.4 |
| 5,550,747 A | * | 8/1996 | Newman, Jr. | 702/76 |
| 6,118,828 A | * | 9/2000 | Schleifer | 375/317 |
| 6,167,246 A | * | 12/2000 | Elder et al. | 455/313 |
| 6,263,196 B1 | * | 7/2001 | Miyashita | 455/161.1 |
| 6,317,034 B1 | * | 11/2001 | Issa et al. | 340/426.25 |
| 6,487,264 B1 | * | 11/2002 | Alley et al. | 375/361 |
| 6,668,165 B1 | * | 12/2003 | Cloutier | 455/336 |

* cited by examiner

Primary Examiner—Tesfaldet Bocure
Assistant Examiner—Pankaj Kumar
(74) Attorney, Agent, or Firm—Bill C. Panagos

(57) ABSTRACT

A super-regenerative receiver is provided with a regenerative oscillator controlled by a frequency sweep circuit to control the bandwidth at which the receiver can receive a signal. A quench control circuit controls both the regenerative oscillator and the frequency sweeping circuit to "turn on" at the same time. The frequency sweep circuit forces the regenerative oscillator to function as a center frequency movable bandpass filter allowing the receiver to automatically tune to the actual transmitter frequency $f_{tx}$ to provide the best reception. This allows the receiver/filter bandwidth to be very narrow. The receiver operates as an amplitude detector, as well as a frequency or phase detector, thereby allowing the same receiver to detect AM (ASK) signals and FM or FSK signals without adding a frequency discriminator.

6 Claims, 1 Drawing Sheet

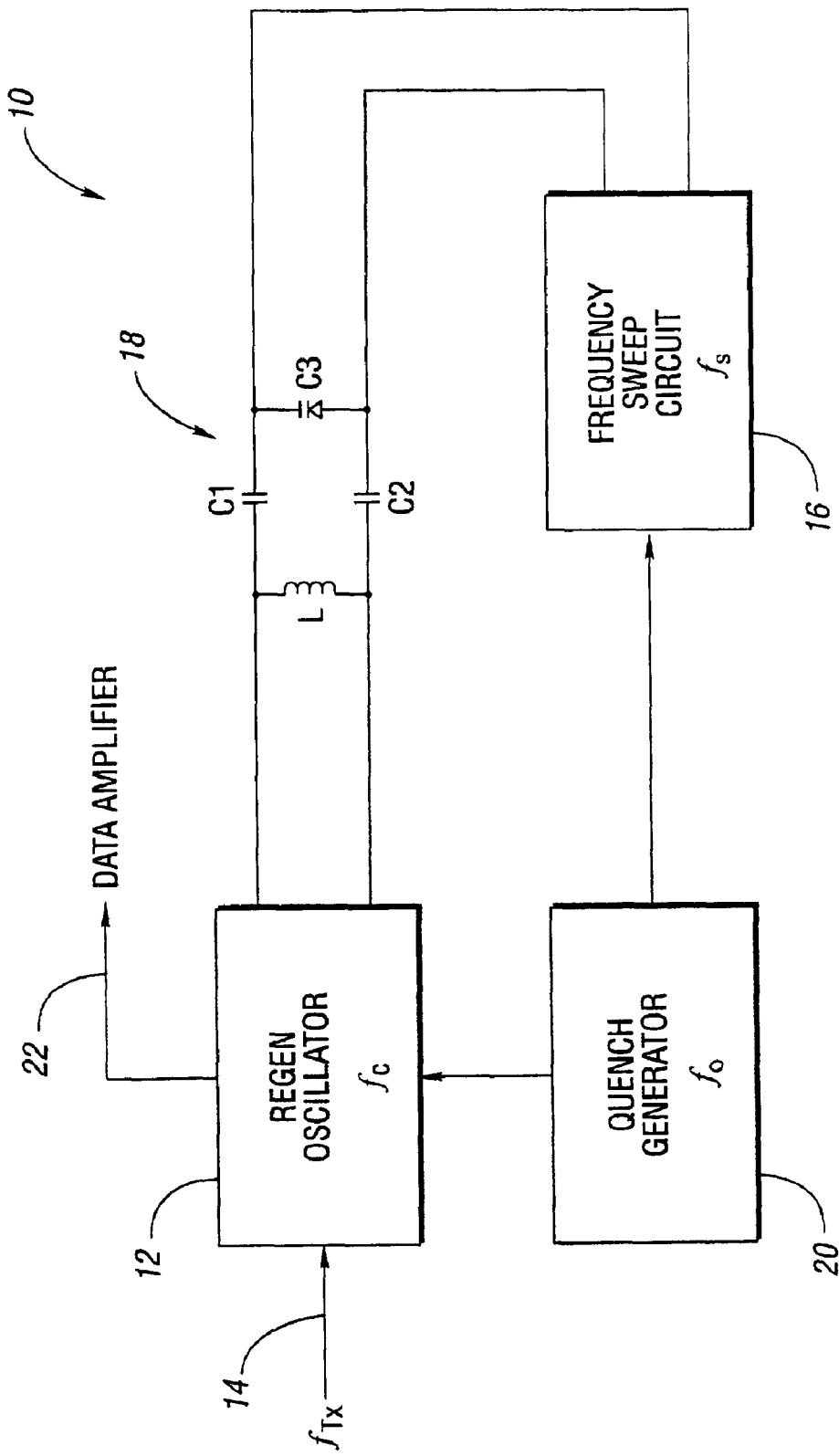

TUNELESS NARROW-BAND SUPER-REGENERATIVE RECEIVER

TECHNICAL FIELD

The present invention generally relates to radio frequency (RF) receivers, and more particularly to an improved super-regenerative receiver arrangement capable of receiving narrow-band signals.

BACKGROUND ART

Currently, super-regenerative type receivers are used in connection with wireless/RF security and remote control systems such as vehicle remote keyless entry (RKE) systems because of the low cost of manufacture. Generally, a super-regenerative receiver operates using an oscillating signal detector having the oscillation interrupted, i.e., "quenched," at a relatively low frequency. However, because the quenching operation and frequency force the detector response to be very broad, super-regenerative receivers suffer from the need to use "tuned" input circuits to allow them to be used with narrow-band signals. While such tuned input circuits improve detector response, such receivers still suffer from generally poor selectivity (wide band) characteristics in addition to the added expense of the tuned input circuits.

As a result, a need exists for a super-regenerative receiver capable of operating satisfactorily in narrow-band applications.

DISCLOSURE OF INVENTION

It is therefore an object of the present invention to provide a super-regenerative receiver which can operate with a narrowband without requiring a tuned input circuit.

It is another object of the present invention to provide a cost effective super-regenerative receiver that can operate in a narrow-band application.

It is yet another object of the present invention to provide a super-regenerative receiver that can detect AM (ASK) signals and FM or FSK signals without adding a frequency discriminator.

In accordance with these and other objects, the present invention provides a narrow bandwidth, super-regenerative receiver that includes a signal detector having a regenerative oscillator for detecting a signal transmitted at a particular transmit frequency, a quench circuit connected to the regenerative oscillator for interrupting the oscillation of the oscillator at a predetermined frequency, and a frequency sweeping circuit connected to the regenerative oscillator and the quench circuit. The quench circuit is arranged to cycle the regenerative oscillator and the frequency sweeping circuit on and off together, and the frequency sweeping circuit controls operation of the regenerative oscillator to a desired narrow bandwidth around the transmit frequency.

With the present invention, a super-regenerative receiver arrangement is advantageously provided that does not require any tuned input circuits, and can demodulate AM (amplitude shift keying (ASK) ) as well as FM (frequency shift keying (FSK)) signals using the same receiver detector. The present invention utilizes a quench controlled frequency sweeping circuit to allow the receiver to automatically shift about a particular frequency of an associated transmitter to improve overall sensitivity and tolerance of transmitter frequency variation. Further, wide band noise is significantly reduced.

These and other advantages of the present invention will become apparent to one of ordinary skill in the art in light of the following description and attached drawings.

BRIEF DESCRIPTION OF DRAWINGS

The FIGURE is a block circuit diagram of a tuneless narrow-band super-regenerative receiver in accordance with the present invention.

BEST MODE FOR CARRYING OUT THE INVENTION

The FIGURE provides a block diagram for an improved super-regenerative receiver 10 in accordance with the present invention. As shown, a regenerative oscillator 12 is arranged to receive a transmitted signal 14 such as via an antenna (not shown). A frequency sweeping circuit 16 provides an input to the regenerative oscillator via an inductor-capacitor network 18 to control the bandwidth at which the receiver can receive a signal. The inductor-capacitance network establishes the sweep bandwidth, and is preferably arranged to provide a narrow-band. The frequency sweeping circuit can be implemented using a low cost surfaced acoustic wave resonator (SAWR), ceramic resonator or LC resonator.

The frequency $f_c$ of the regenerative oscillator is interrupted by a quench control circuit 20. The quench control circuit also controls the frequency $f_s$ of frequency sweeping circuit 16. In operation, quench control circuit 20 cycles both the regenerative oscillator and the frequency sweeping circuit 12 to "turn on" at the same time. The frequency sweeping circuit causes receiver 10 to sweep across a predetermined frequency band defined to cover a desired transmitter frequency. An output signal 22 of the receiver will then approach a maximum signal amplitude when the center frequency is equal to transmitter frequency.

In accordance with the present invention, for a center frequency $f_c$, sweep frequency $f_s$, quench frequency $f_q$, data rate (for digital modulation) or a maximum base band frequency (for analog modulation) $f_d$, and sweep frequency bandwidth $BW_s$, the following design characteristics must be met:

$BW_s = 1-3\% \ f_c;$ $f_s = f_q;$ $f_s > 2 \ fd$, and preferably $f_s = 10 f_d;$ and $f_c >> f_s$ or $f_q.$ In operation, the frequency sweep circuit forces the regenerative oscillator to function as a center frequency movable bandpass filter. The receiver will thus automatically tune to the actual transmitter frequency $f_{tx}$ to provide the best reception. The filter bandwidth can thus be very narrow because the impact of variation in the transmitter frequency, such as caused by variations in temperature, is minimized.

Thus, the present invention advantageously provides a tuneless narrow band super-regenerative receiver without adding cost. The receiver operates as an amplitude detector, as well as a frequency or phase detector. In other words, the receiver of the present invention can detect AM (ASK) signals and FM or FSK signals without adding a frequency discriminator. In addition, the design lends itself to integration into a single circuit chip, thereby further enhancing use of the receiver in a RKE system.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A narrow bandwidth, super-regenerative receiver comprising:
   a signal detector having a regenerative oscillator for detecting a signal transmitted at a particular transmit frequency;
   a quench circuit connected to the regenerative oscillator for interrupting the oscillation of the oscillator at a predetermined frequency; and
   a frequency sweeping circuit connected to the regenerative oscillator and the quench circuit, wherein the quench circuit is arranged to cycle the regenerative oscillator and the frequency sweeping circuit on and off together, and the frequency sweeping circuit controls operation of the regenerative oscillator to a desired narrow bandwidth around the transmit frequency.

2. The receiver of claim 1 further comprising: for a center frequency $f_c$, a sweep frequency $f_s$, a quench frequency $f_q$, a data rate or a maximum base band frequency of the transmitted signal $f_d$, and a sweep frequency bandwidth $BW_s$, the following design characteristics:

$$BW_s = 1-3\% \, f_c;$$

$$f_s = f_q;$$

$$f_s > 2 \, f_d; \text{ and}$$

$$f_c >> f_s \text{ or } f_q.$$

3. The receiver of claim 2 wherein $f_s = 10 f_d$.

4. The receiver of claim 1 wherein the frequency sweeping circuit comprises a surfaced acoustic wave resonator.

5. The receiver of claim 1 wherein the frequency sweeping circuit comprises a ceramic resonator.

6. The receiver of claim 1 wherein the frequency sweeping circuit comprises an LC resonator.

* * * * *